(12) United States Patent
Bae

(10) Patent No.: US 12,513,834 B2
(45) Date of Patent: Dec. 30, 2025

(54) DISPLAY DEVICE

(71) Applicant: LG ELECTRONICS INC., Seoul (KR)

(72) Inventor: Jae Hyeok Bae, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 204 days.

(21) Appl. No.: 18/236,778

(22) Filed: Aug. 22, 2023

(65) Prior Publication Data

US 2024/0365481 A1    Oct. 31, 2024

(30) Foreign Application Priority Data

Apr. 27, 2023  (KR) .................. 10-2023-0055808

(51) Int. Cl.
*H05K 5/02* (2006.01)
*G09F 9/30* (2006.01)
*H05K 5/03* (2006.01)

(52) U.S. Cl.
CPC ............. *H05K 5/0217* (2013.01); *G09F 9/30* (2013.01); *H05K 5/03* (2013.01)

(58) Field of Classification Search
CPC ....... H05K 5/03; H05K 5/0017; H05K 5/0217
USPC ....................................................... 361/807
See application file for complete search history.

(56) References Cited

U.S. PATENT DOCUMENTS

| | | | |
|---|---|---|---|
| 10,463,126 B2 | 11/2019 | Mallory et al. | |
| 2015/0092346 A1* | 4/2015 | Ben .................. | G06F 1/1626 |
| | | | 248/688 |
| 2019/0281965 A1* | 9/2019 | Yoo ..................... | A45F 5/00 |
| 2020/0310488 A1* | 10/2020 | Lin .................. | G02B 27/0176 |
| 2021/0153635 A1* | 5/2021 | Vasquez ............... | A45F 5/00 |

FOREIGN PATENT DOCUMENTS

| | | |
|---|---|---|
| KR | 1020080023558 | 3/2008 |
| KR | 10-1753173 | 7/2017 |

OTHER PUBLICATIONS

Korean Intellectual Property Office Application No. 10-2023-0055808, Office Action dated Jul. 1, 2024, 4 pages.

* cited by examiner

*Primary Examiner* — Hung S. Bui
(74) *Attorney, Agent, or Firm* — LEE, HONG, DEGERMAN, KANG & WAIMEY

(57) ABSTRACT

Provided is a display device. The display device comprises a main body with a strap receiving portion recessed into a periphery of the main body; a display panel installed in the main body; a strap accommodated along the periphery of the main body in the strap receiving portion; and a strap locker connected to the strap to lock or unlock the strap.

19 Claims, 21 Drawing Sheets

(a)

(b)

DISPLAY DEVICE

CROSS-REFERENCE TO RELATED APPLICATION

Pursuant to 35 U.S.C. § 119 (a), this application claims the benefit of earlier filing date and right of priority to Korean Patent Application No. 10-2023-0055808, filed on Apr. 27, 2023, the contents of which are hereby incorporated by reference herein in its entirety.

BACKGROUND

The present invention relates to display device.

Display device is a device that visually outputs information on a screen and can comprise a liquid crystal display device (LCD), an organic light emitting diode (OLED), a plasma display panel (PDP), etc.

The display device may be fixedly mounted on a wall, installed on a stand, or placed on a table.

When the display device is provided with a strap or string, the display device may be used by hanging the strap or string on a wall, or may be carried over a short distance by hanging the strap or string on a shoulder.

Korea Patent Registration No. 10-1753173 B1 (published on Jul. 4, 2017) discloses a smartphone protective case having an elastic material string, and the smartphone protective case comprises a case body covering the smartphone to protect the smartphone; a string installed along at least one side of the peripheral surface of the case body surrounding the side of the smartphone and made of an elastic material, the string is provided at the periphery of the case body so as to be elastically expandable in an outer direction of the case body.

SUMMARY

Embodiments provide a display device capable of covering a strap and the strap can be easily deformed.

A display device comprises a main body with a strap receiving portion recessed into a periphery of the main body; a display panel installed in the main body; a strap accommodated along the periphery of the main body in the strap receiving portion; and a strap locker connected to the strap to lock or unlock the strap.

The main body may comprise a top case forming an outer peripheral appearance of the display device; and a bottom cover forming a rear appearance of the display device, the at least one of the top case and the bottom cover may be formed with the strap receiving portion.

The main body may further comprise a strap guide arrange in the periphery and spaced apart from the strap receiving portion.

Display device may further comprise a guide bracket disposed inside the strap guide.

The guide bracket may comprise an outer guide bracket; and an inner guide bracket disposed inside the outer bracket.

The strap may have a portion located between the outer guide bracket and the inner guide bracket, the portion may be guided by the outer guide bracket and the inner guide bracket.

Display device may further comprise a strap adjusting clip movably disposed along the strap receiving portion.

The main body may comprise a middle bracket disposed between the display panel and the bottom cover.

The strap adjustment clip may be provided with a sliding guide guided along the middle bracket.

One embodiment of the strap locker may comprise a rail fixed to the main body and formed with at least one rail hole; a slider connected to the strap and having at least one slider hole; a slider holder having a first protrusion inserted into the rail hole and a second protrusion inserted into the slider hole; and a lever moving the slider holder so that the first protrusion is drawn out of the rail hole.

One embodiment of the strap locker may further comprise a lever lock movably disposed on the lever, a locking hole through which the lever lock may be locked in the slider.

The lever may be formed with a lever lock guide in which the lever lock is guided in a longitudinal direction of the lever lock and elastically deforms the lever lock.

An accommodating portion in which a rotating shaft of the lever is rotatably received may be formed in the slider.

The lever may comprise a pressing body that contacts the slider holder to raise the slider holder when the lever is rotated about the rotation shaft.

The slider holder may comprise a lever contact body spaced apart from or in contact with the pressing body.

The lever may comprise a cam body coming in contact with the slider holder and lowers the slider holder when the lever rotates reversely about rotation shaft.

One embodiment of the strap locker may further comprise an elastic member disposed on the slider and elastically supporting the slider holder.

A gap in which the lever may be accommodated may be formed between the rail and the slider.

The strap locker may further comprise a strap clamp plate disposed between the rail and the strap, fastening holes through which a fastening member pass may be formed in the strap clamp plate, the strap, and the slider.

Another embodiment of the strap locker may comprise a rail fixed to the main body and having a plurality of locking grooves; a slider connected to the strap and having a button accommodating portion; a button seated on the rail and formed with a locking protrusion caught in the locking grooves; and an elastic member disposed between the slider and the button to support the button.

A pair of the rails may be spaced apart in the front and rear directions.

The button may comprise a pair of seating bodies accommodated in the button accommodating portion and mounted on each of a pair of rails; and a button body penetrating between the pair of rails. The elastic member seated on the button body.

The slider may be arranged between the middle bracket and the rail.

DETAILED DESCRIPTION OF THE EMBODIMENTS

Hereinafter, specific embodiments of the present invention will be described in detail with drawings.

Figure 1:
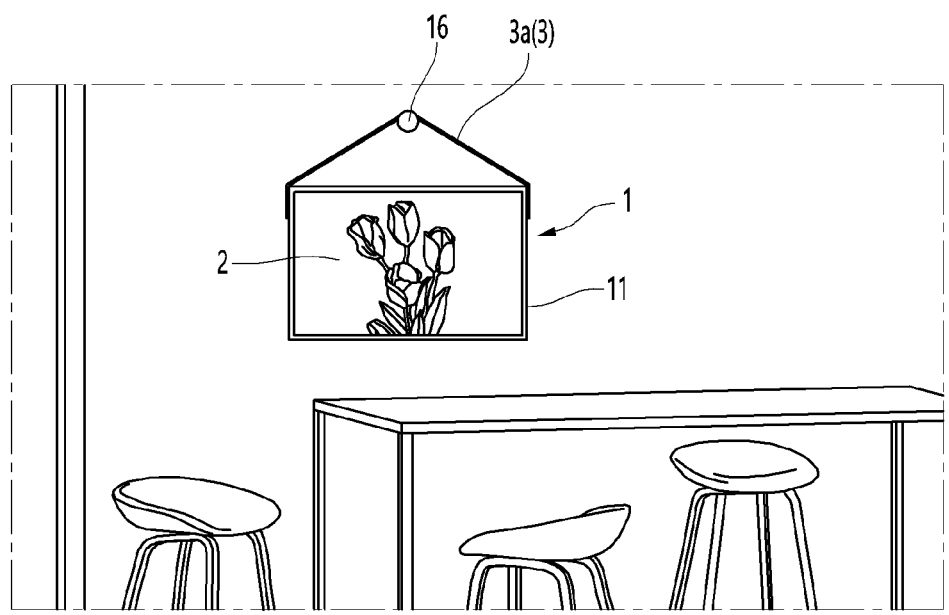
FIG. 1 is a view when a display device according to this embodiment is hung on a wall by a strap.
Figure 2:
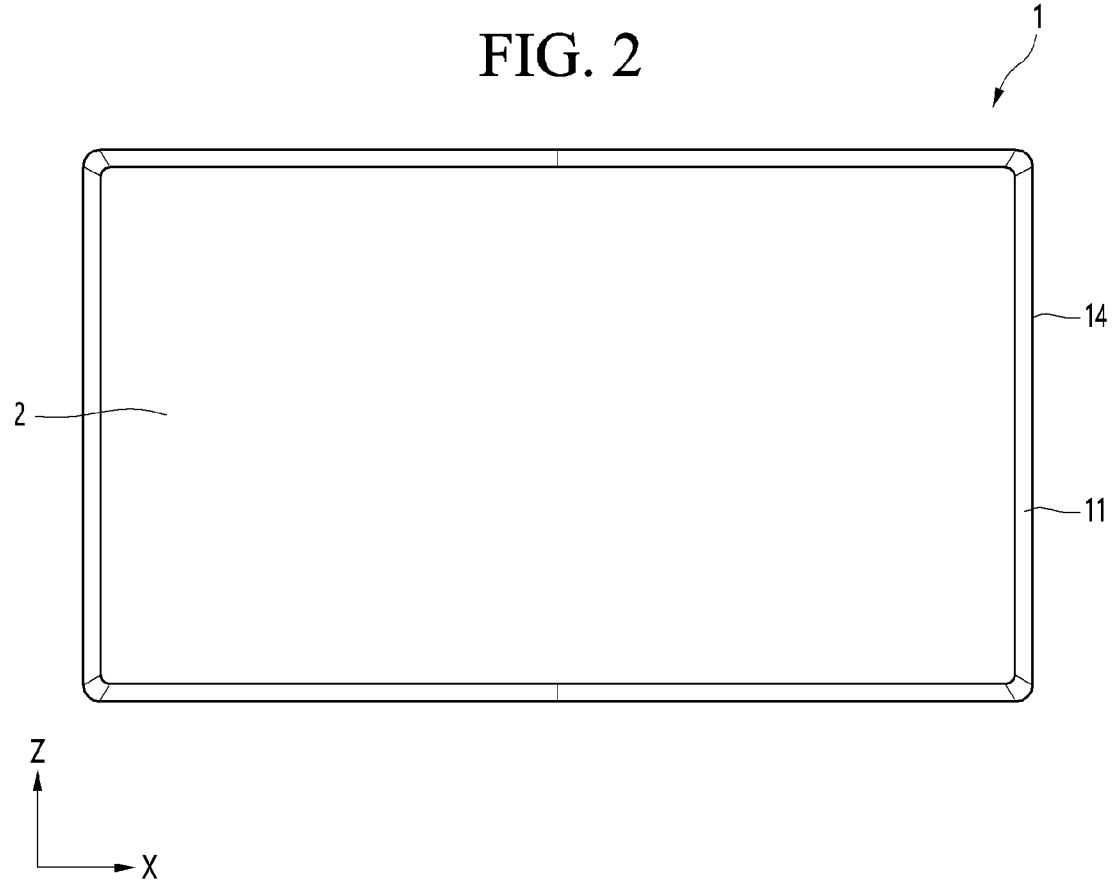
FIG. 2 is a front view showing an example of the main body when the strap shown in FIG. 1 is hidden in the display device.
Figure 3:
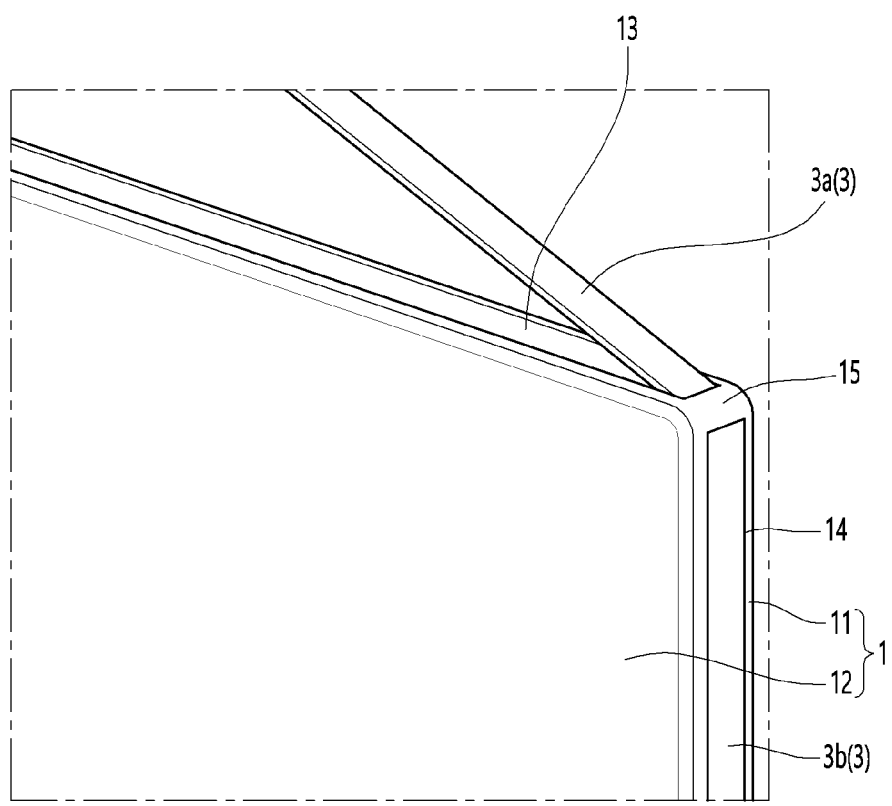
FIG. 3 is a partial perspective view showing a rear surface and a periphery of the display device according to the present embodiment.

FIG. 1 is a view when a display device according to this embodiment is hung on a wall by a strap, FIG. 2 is a front view showing an example of the main body when the strap shown in FIG. 1 is hidden in the display device, FIG. 3 is a partial perspective view showing a rear surface and a periphery of the display device according to the present embodiment.

The display device may comprise a main body 1, a display panel 2 installed in the body 1, and a strap 3 provided on the body 1.

The main body 1 may comprise a top case 11 and a bottom cover 12. The main body 1 may have a rectangular shape in which the length in the left-right direction X is longer than the length in the vertical direction Z.

The top case 11 may form an outer peripheral appearance of the display device.

The bottom cover 12 may form a rear appearance of the display device.

A strap receiving portion 13 in which the strap 3 is accommodated may be formed in the main body 1. The strap receiving portion 13 may be formed in a shape recessed into the periphery 14 of the main body 1.

The strap receiving portion 13 may be formed on at least one of an upper periphery, a lower periphery, a right periphery, and a left periphery of the main body 1.

The strap receiving portion 13 will be described as being formed on each of the upper periphery, the lower periphery, the right periphery, and the left periphery of the main body 1, but is not limited thereto, and it is also possible that some the upper periphery and the lower periphery, the right periphery, and the left periphery of the main body 1 are not formed.

A plurality of strap receiving portions 13 may be formed in the body 1, and the plurality of strap receiving portions 13 comprise an upper strap receiving portion formed on an upper periphery of the body 1, a lower strap receiving portion formed on a lower periphery of the body 1, and a right strap receiving portion formed on a right periphery of the body 1. and a left strap receiving portion formed on a left periphery of the body 1.

At least one of the top case 11 and the bottom cover 12 may have a strap receiving portion 13 recessed therein.

As an example of the main body 1 shown in FIG. 3, the top case 11 may form the periphery 14 of the main body 1, and the strap receiving portion 13 may be formed with the top case 11.

Strap guides 15 for guiding the strap 3 may be formed at four vertices portion of the periphery 14 of the top case 11. The strap guide 15 may be integrally formed with the top case 11.

An outer surface of the strap guide 15 may be formed as a curved surface, and the strap guide 15 may be spaced apart from the strap receiving portion 13.

One end of the strap guide 15 may be spaced apart from the strap accommodating portion 3, a gap through which the strap 3 may pass may be formed between one end of the strap guide 15 and the strap accommodating portion 13 and a gap through which the strap 3 can pass may be formed between the other end of the strap guide 15 and the strap receiving portion 13.

The main body 1 may further comprise a middle bracket. The middle bracket may be disposed between the display panel 2 and the bottom cover 12.

The display panel 2 may comprise a liquid crystal display (LCD), an organic light emitting diode (OLED) display, a plasma display panel (PDP), and the like.

The display panel 2 may be located inside the periphery 14 of the main body 1, and may form the front appearance of the display device.

The strap 3 can be accommodated in the strap receiving portion 13 and can be accommodated along the periphery 14 of the main body 1.

The strap 3 may extend to the inside of the strap guide 15 through a gap between the strap accommodating portion 13 and one end of the strap guide 15, the strap 3 may extend inside the strap accommodating portion 13 through a gap between the other end of the strap guide 15, and the strap accommodating portion 13.

When the straps 3 is not in use, all of the straps 3 may be inserted into and accommodated in the strap receiving portion 13, and when the straps 3 in use, as shown in FIG. 3. the straps 3 can be withdrawn to the outside.

The strap 3 may be guided by the strap guide 15 and may be bent based on the strap guide 15.

That is, when the strap 3 is used, a portion 3a of the strap 3 is located outside the strap receiving portion 13, and the remainder 3b of the strap 3 can be accommodated in the strap receiving portion 13.

When the strap 3 is not in use, when viewing the display device from the front, the front of the main body 1 and the front of the display panel 2 can be seen, and the strap 3 is accommodated in the strap receiving portion 13, may not be visible from the front of the display device.

As shown in FIG. 1, the portion 3a of the strap 3 drawn out of the strap receiving portion 13 is caught on the fixing member 16 installed on the wall, hung on the user's shoulder, or held by the user's hand. In this state, movement of the display device may be assisted.

Figure 4:
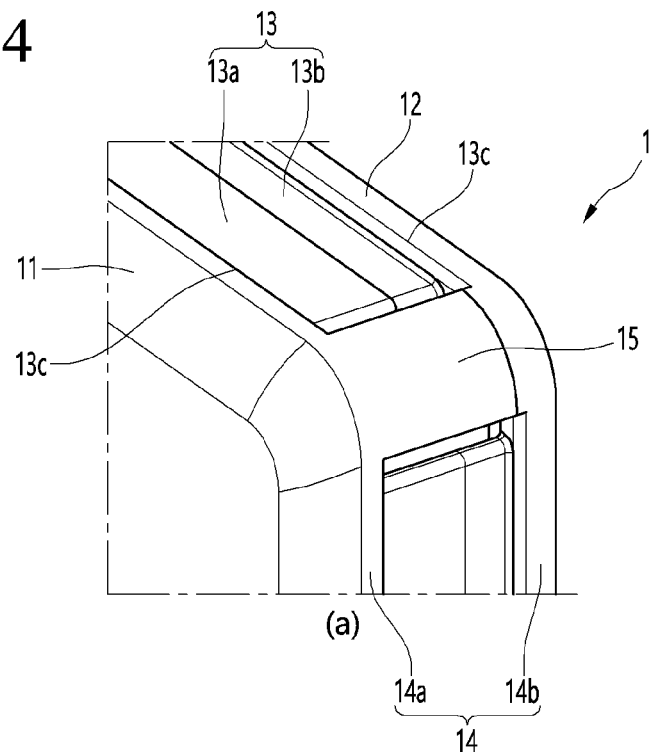
FIG. 4 is a view showing another example of a main body according to this embodiment.
Figure 4:
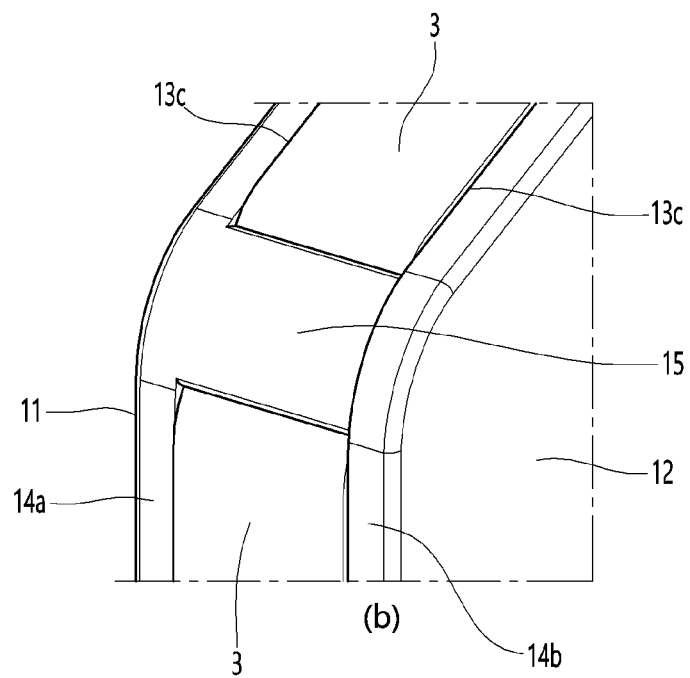

FIG. 4 is a view showing another example of a main body according to this embodiment.

FIG. 4(a) is a partial perspective view when the front and periphery of the display device are shown and the strap is not provided on the periphery of the main body, FIG. 4(b) is a partial perspective view when a rear surface and periphery of the display device are shown and the strap is provided on the periphery.

The other example of the main body 1 is that the top case 11 may form the front portion 14a of the periphery 14 of the main body 1, the bottom cover 12 may form the rear portion 14b of the periphery 14 of the main body 1, and the strap receiving portion 13 may be formed on the top case 11 and the bottom cover 12, respectively, as shown in (a) of FIG. 4

A front strap accommodating portion 13a accommodating the front portion of the strap 3 may be formed in the top case 11, and a rear strap accommodating portion 13b accommodating the rear portion of the strap 3 may be formed in the bottom cover 12.

The strap 3 may be inserted and accommodated in the front strap accommodating portion 13a formed in the top case 11 and the rear strap accommodating portion 13b formed in the bottom cover 12 along the rim 14.

The strap guide 15 may be formed at a vertex portion of at least one edge of the top case 11 and the bottom cover 12.

The strap guide 15 may protect the strap 3 from the outside of the substantially orthogonally bent portion of the strap 3.

The other example of the main body 1, a round portion 13c may be formed in the strap receiving portion 13. The round portion 13c can minimize wear on the edge of the strap 3.

Figure 5:
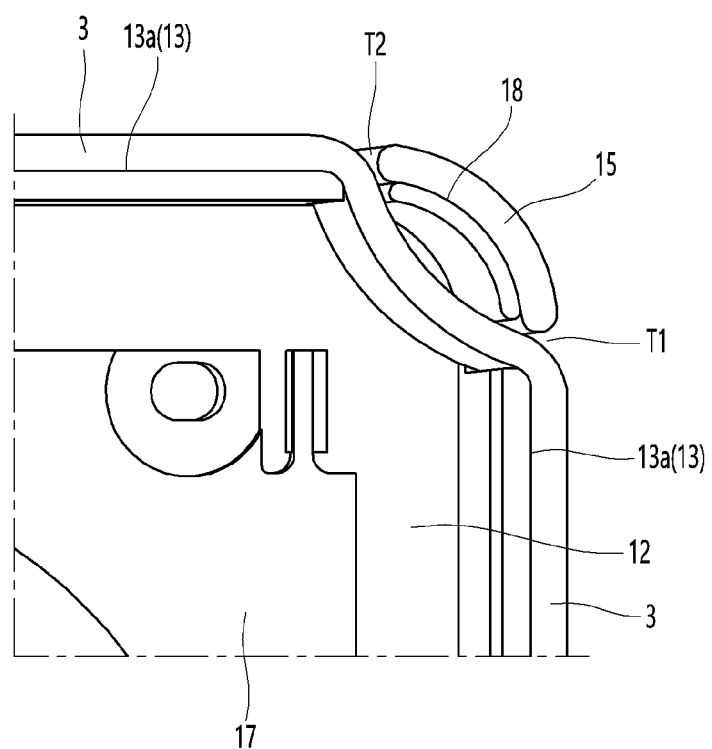
FIG. 5 is a partial perspective view showing the inside of another example of the main body according to the present embodiment.

FIG. 5 is a partial perspective view showing the inside of another example of the main body according to the present embodiment.

The main body 1 may further include a middle bracket 17. The middle bracket 17 may be disposed between the display panel 2 and the bottom cover 12.

Inside the main body 1, as shown in FIG. 5, a rigid insert 18 may be disposed. The rigid insert 18 may be formed of a metal material and may be inserted inside the strap guide 15 in preparation for insufficient rigidity and strength of the case top 11.

The rigid insert 18 may be screwed to the middle bracket 17 or inserted between the top case 11 and the bottom cover 12 by fitting.

The rigid insert 18 may be positioned on the inner surface of the strap guide 15 and may be positioned between the strap guide 15 and the strap 3.

Like the strap guide 15, the rigid insert 18 may be convexly curved toward the outside of the display device.

The rigid insert 18 may be spaced apart from each of the pair of adjacent strap receiving portions 3. A gap T1 passing through the strap 3 may be formed between one end of the rigid insert 18 and any one of the pair of adjacent strap receiving portions 3. A gap T2 through which the strap 3 passes may be formed between the other end of the rigid insert 18 and the other one of the pair of strap receiving portions 3.

Figure 6:
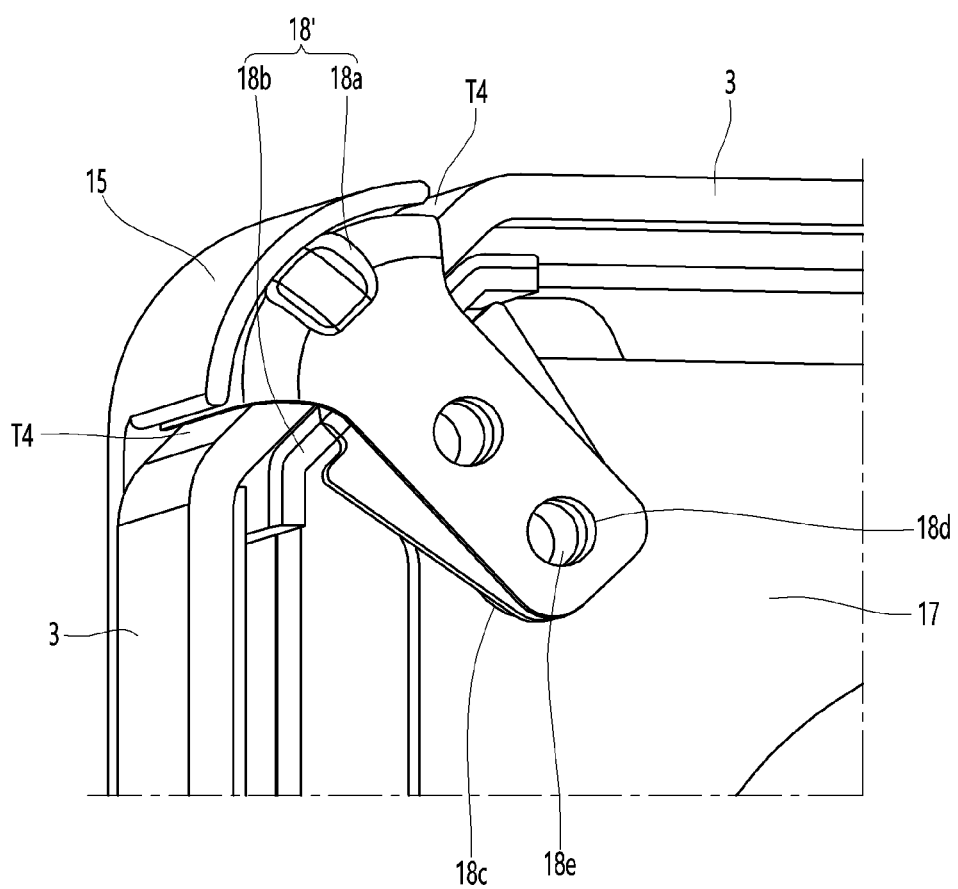
FIG. 6 is a view showing another example modification of the main body according to the present embodiment.
Figure 7:
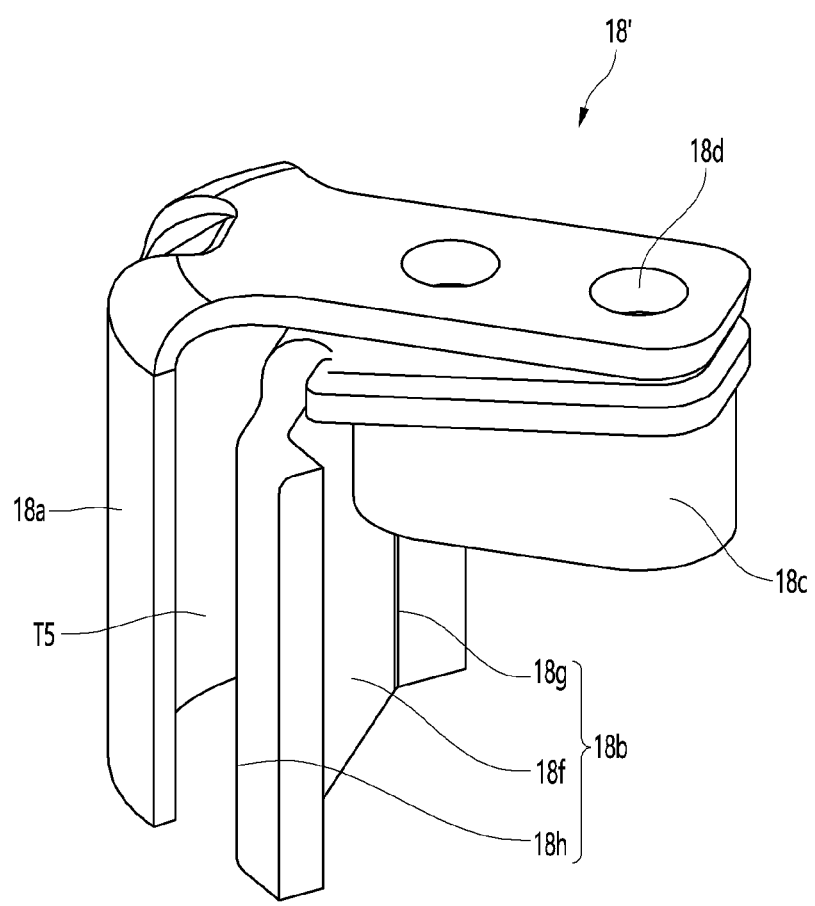
FIG. 7 is a perspective view of the guide bracket shown in FIG. 6.

FIG. 6 is a view showing another example modification of the main body according to the present embodiment, FIG. 7 is a perspective view of the guide bracket shown in FIG. 6.

As shown in FIG. 6, a guide bracket 18' may be disposed inside the main body 1.

The guide bracket 18' may comprise an outer guide bracket 18a disposed inside the strap guide 15 of the main body 1.

The outer guide bracket 18a may form a clearance gap (T4, see FIG. 6) between the strap 3 and the strap guide 15 to minimize breakage of the strap guide 15, the outer guide bracket 18a can guide the strap 3 so that the contact of the strap 3 and the strap guide 15 can be minimized, The guide bracket 18' may further comprise an inner guide bracket 18b disposed inside the outer guide bracket 18a.

A gap (T5, see FIG. 7) in which the strap 3 can be positioned may be formed between the outer guide bracket 18a and the inner guide bracket 18b.

The guide bracket 18' may be screwed to the middle bracket 17. The guide bracket 18' can be made of materials with high rigidity and strength, such as AL and EGI (electrolytic galvanized iron), and can be screwed to the middle bracket 17 made of materials such as AL and EGI.

Fastening holes 18d and 18e for screwing the guide bracket 18' to the middle bracket 17 may be formed in each of the outer guide bracket 18a and the inner guide bracket 18b.

The fastening hole 18d of the outer guide bracket 18a and the fastening hole 18e of the inner guide bracket 18b may be matched in the front-rear direction, and may be fastened together to the middle bracket 17 with screws.

The inner guide bracket 18b may comprise a spacer portion 18c considering a step difference with the middle bracket 17 and the inner guide bracket 18b. The fastening hole 18e of the inner guide bracket 18b may be opened in the front-rear direction in the inner spacer 18c.

The inner guide bracket 18b may comprise a straight portion 18f, and the route of the strap 3 may be straightened. The inner guide bracket 18b may further comprise a pair of round portions 18g and 18h formed at the ends of the straight part 18f, and the round portions 18g and 18h can minimize a damage on the strap 3.

The strap 3 may be guided to the outer guide bracket 18a and the inner guide bracket 18b between the outer guide bracket 18a and the inner guide bracket 18b.

Figure 8:
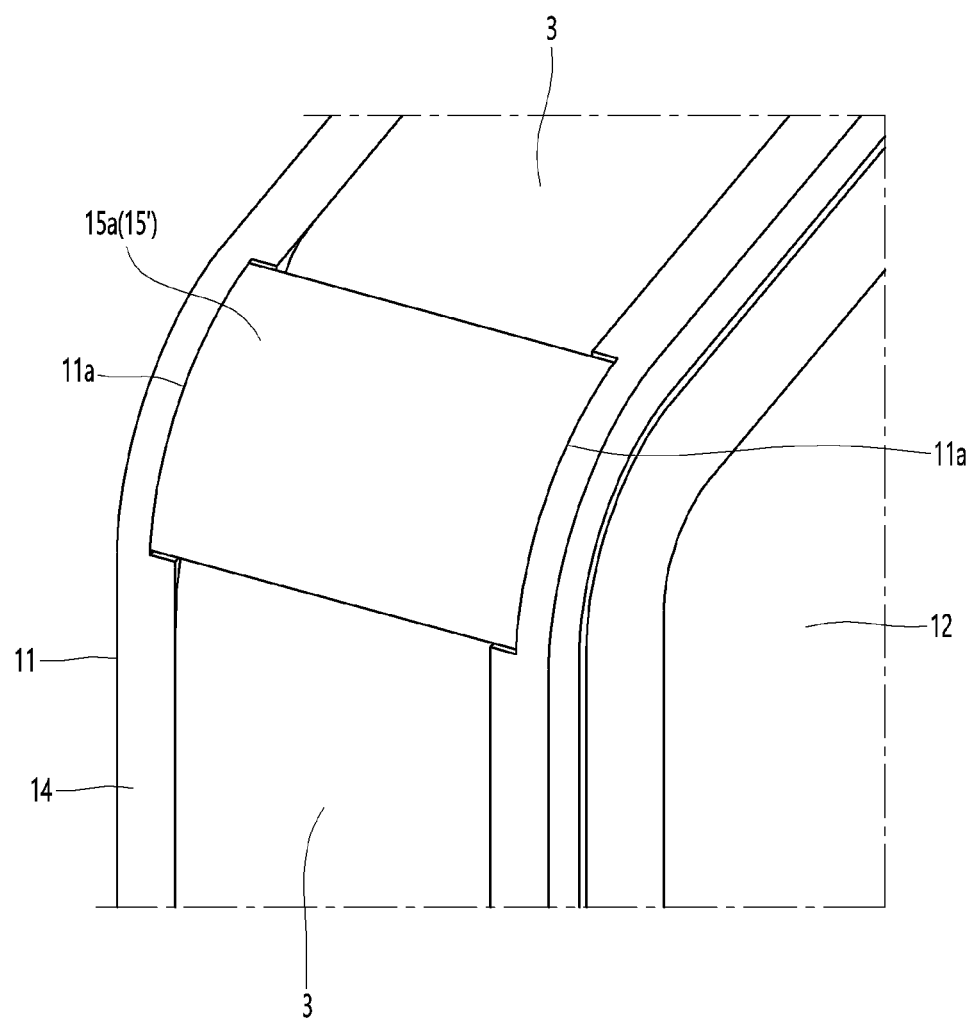
FIG. 8 is a view showing the other example of a main body according to this embodiment.
Figure 9:
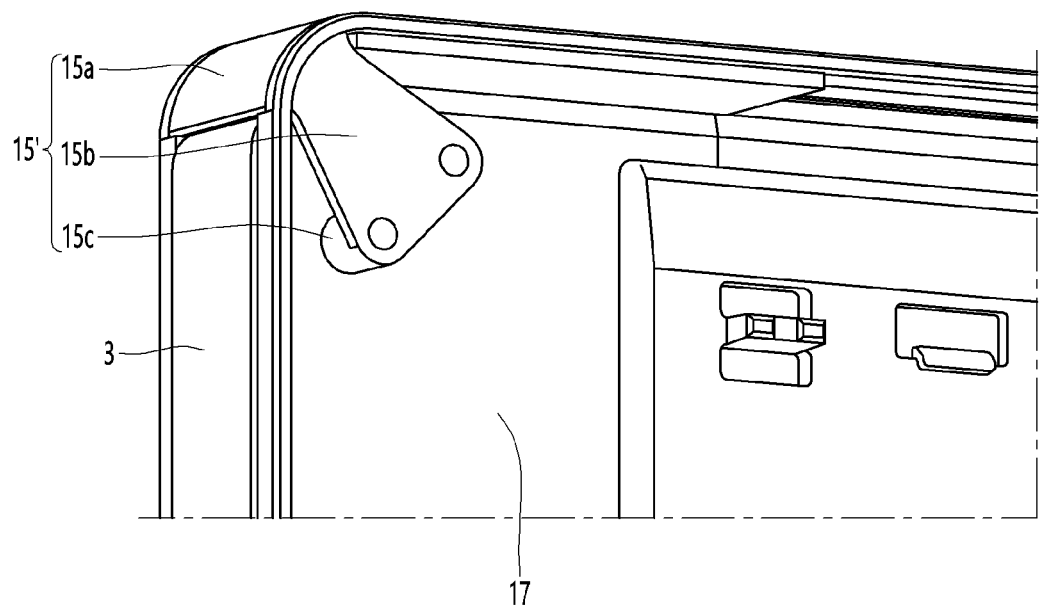
FIG. 9 is a view showing the inside of the other example of a main body according to this embodiment.

FIG. 8 is a view showing the other example of a main body according to this embodiment, FIG. 9 is a view showing the inside of the other example of a main body according to this embodiment.

In the other example of the main body 1, the strap guide 15' is not integrally formed with the top case 11, but may be separately manufactured as the top case 11 and then coupled to the top case 11.

A strap guide accommodating portion 11a in which a portion of the strap guide 15' can be accommodated may be formed at four vertex portion of the periphery of the top case 11, and a portion of the strap guide 15' can be inserted into the strap guide accommodating portion 11a.

The width of the strap guide 15' in the front and rear direction may be greater than the width of the strap 3 in the front and rear direction, and the strap 3 may be guided by the strap guide 15', and can be bent based on the strap guide 15'.

The main body 1 may comprise a middle bracket 17. The middle bracket 17 may be disposed between the display panel 2 and the bottom cover 12.

The strap guide 15' may be coupled to the middle bracket 17.

The strap guide 15' may comprise a guide portion 15a positioned at a vertex portion of the corner of the top case 11 and a coupling portion 15b extending from the guide portion 15a and coupled to the middle bracket 17.

The coupling portion 15b may comprise a spacer portion 15c considering a step difference with the middle bracket 17 and the coupling portion 15b.

The strap guide 15' may be screwed to the middle bracket 17, and fastening holes for screwing to the middle bracket 17 may be formed in the coupling part 15b and the spacer part 15c.

Figure 10:
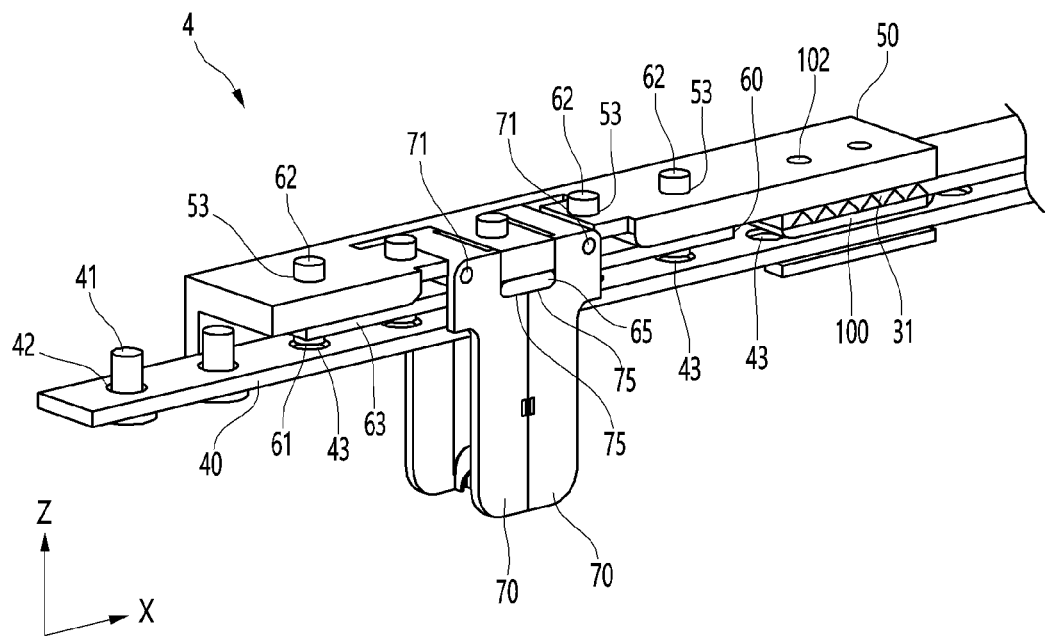
FIG. 10 is a view showing an example of a strap locker according to the present embodiment.
Figure 11:
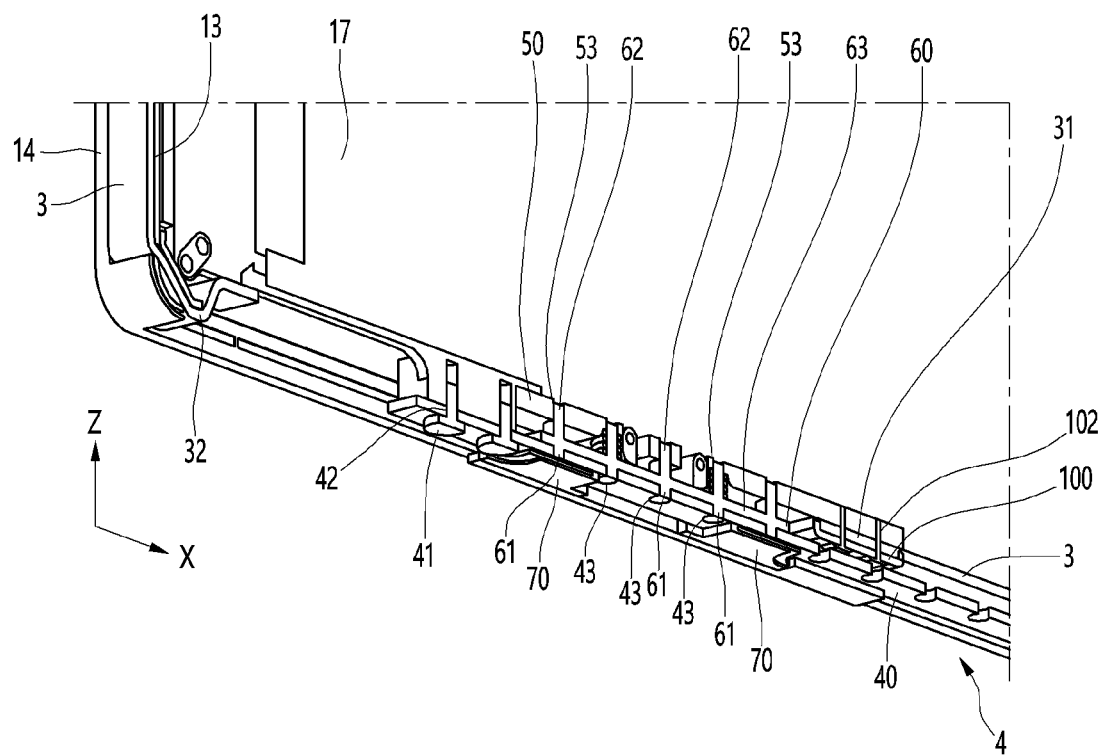
FIG. 11 is a partially cut-off perspective view when an example of a strap locker according to the present embodiment is installed in the main body.
Figure 12:
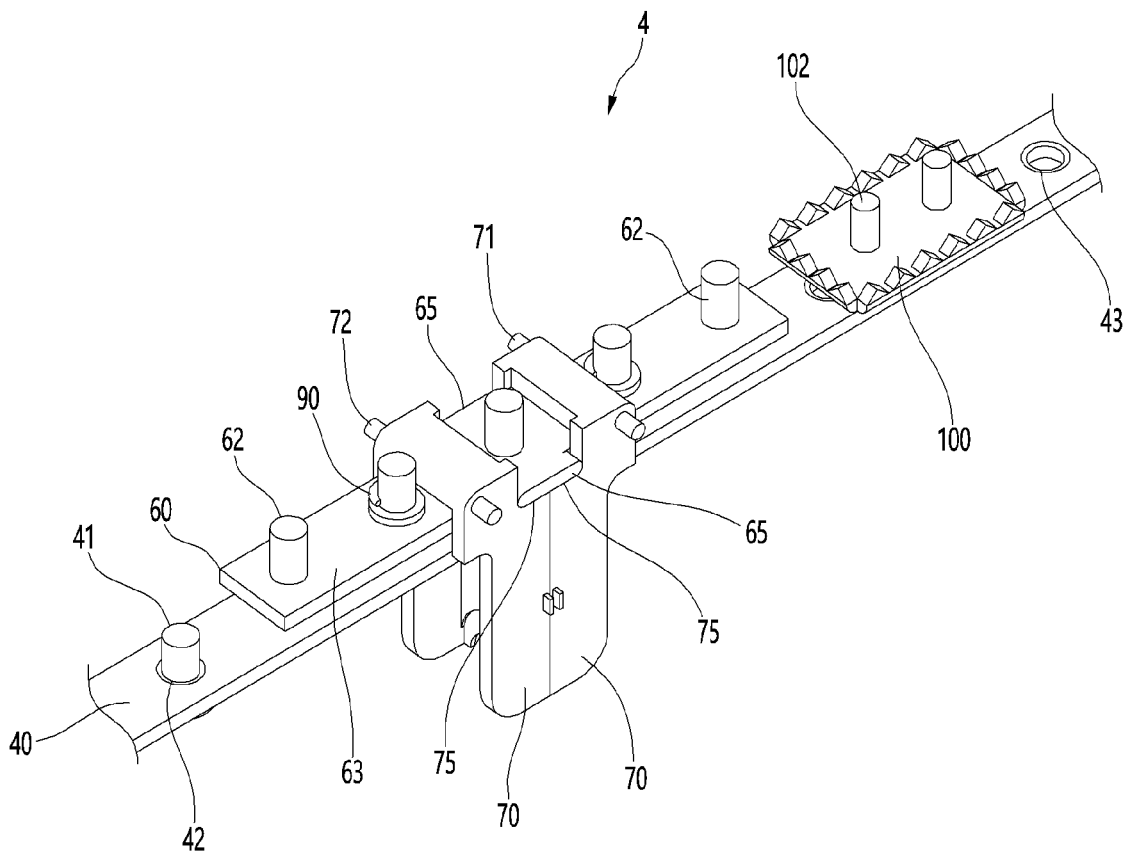
FIG. 12 is a view showing an example of a strap locker when the slider shown in FIG. is separated.
Figure 13:
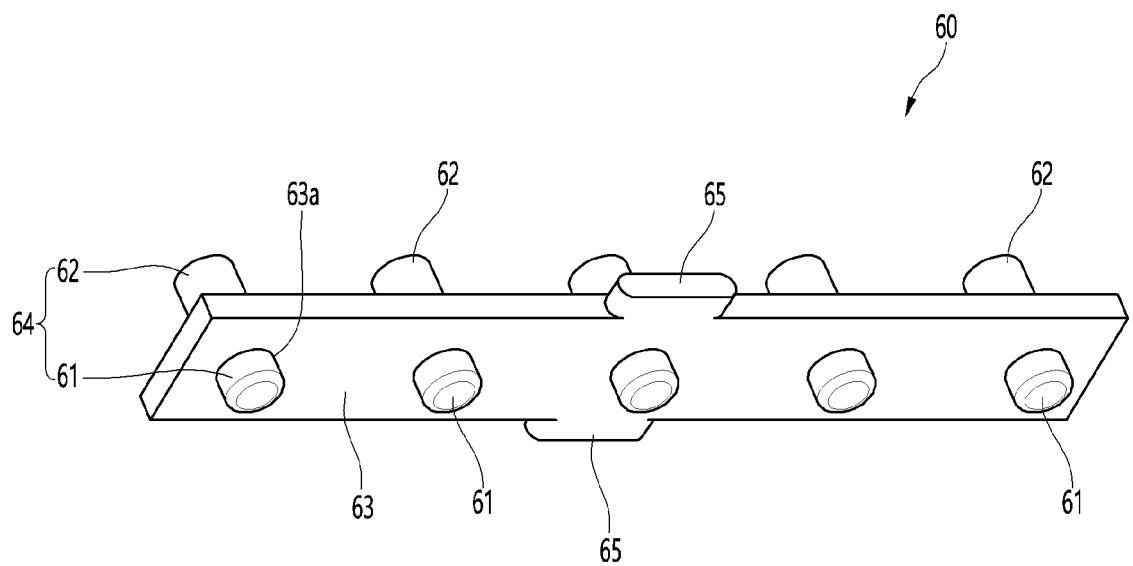
FIG. 13 is a view of the slider holder shown in FIG. 10.
Figure 14:
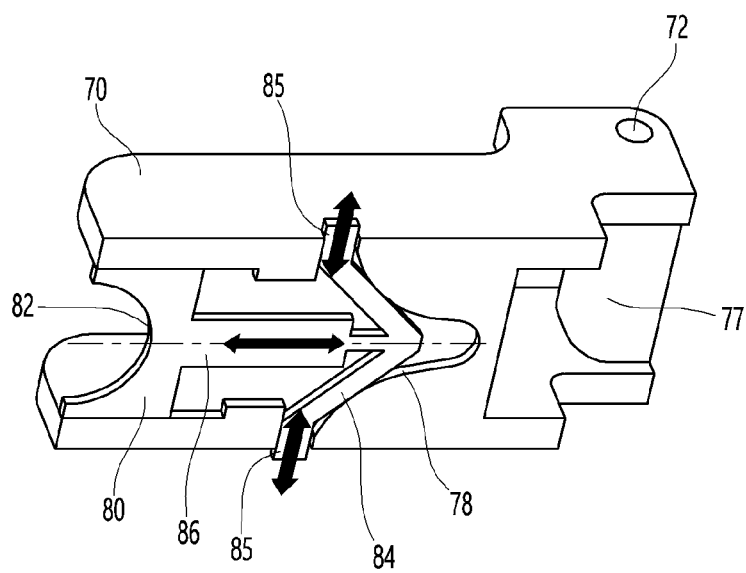
FIG. 14 is a view of the lever shown in FIG. 10.
Figure 15:
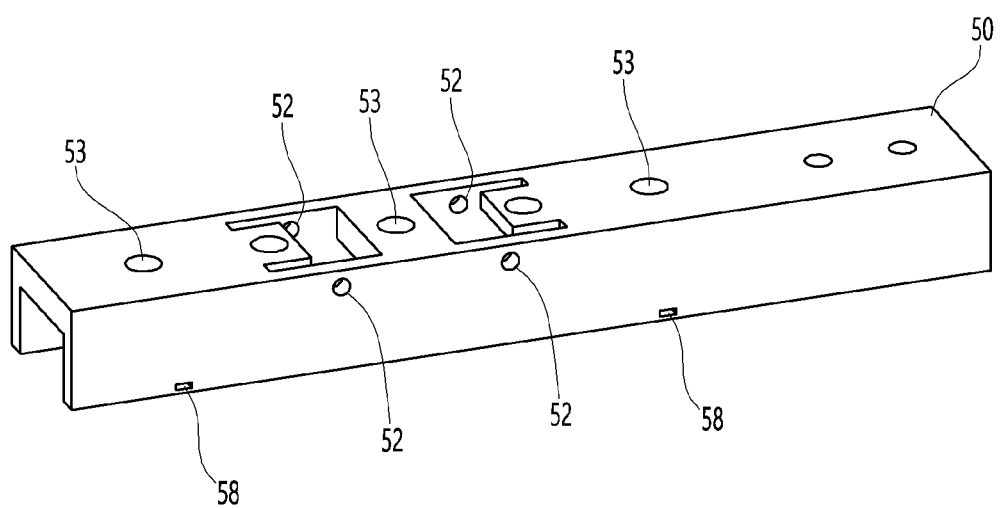
FIG. 15 is a perspective view of the slide shown in FIG. 10.
Figure 16:
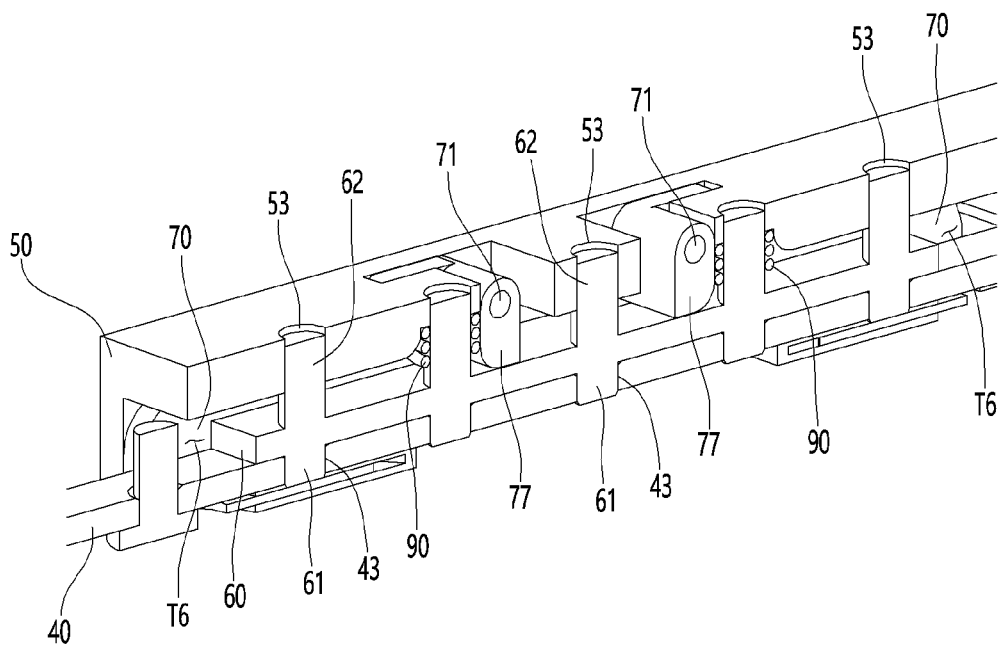
FIG. 16 is a view when the strap according to this embodiment is locked.
Figure 17:
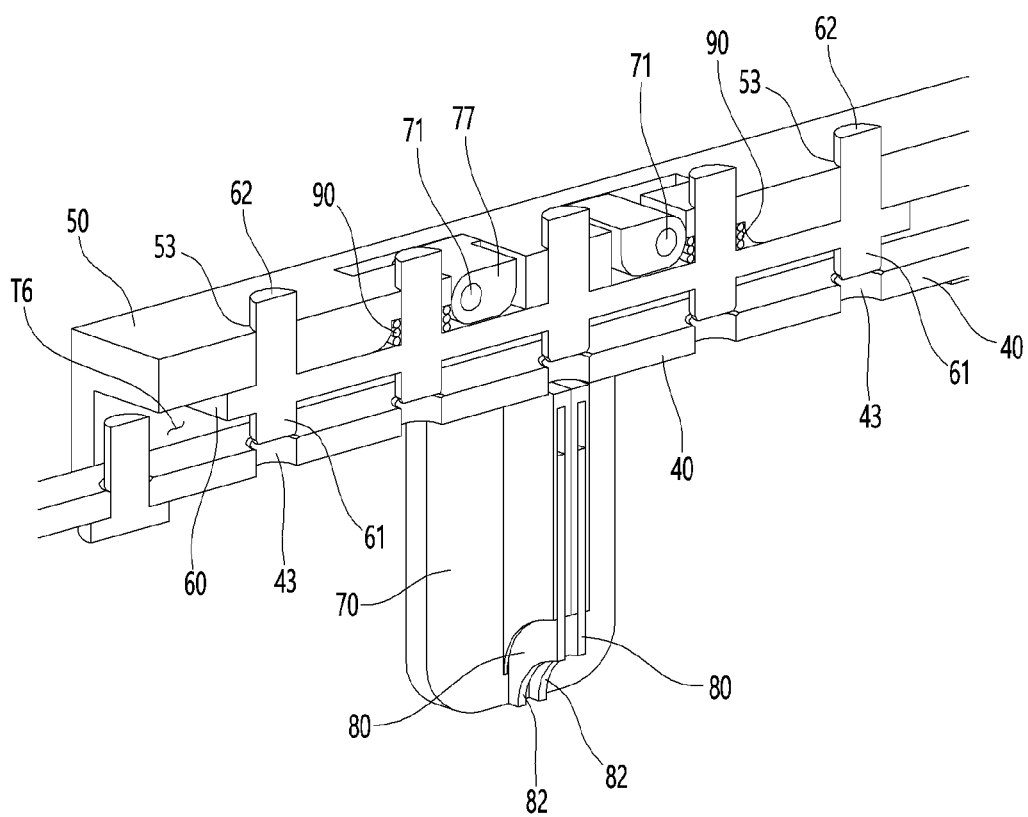
FIG. 17 is a view when the strap according to the present embodiment is unlocked.

FIG. 10 is a view showing an example of a strap locker according to the present embodiment, FIG. 11 is a partially cut-off perspective view when an example of a strap locker according to the present embodiment is installed in the main body, FIG. 12 is a view showing an example of a strap locker when the slider shown in FIG. 10 is separated, FIG. 13 is a view of the slider holder shown in FIG. 10, FIG. 14 is a view of the lever shown in FIG. 10, FIG. 15 is a perspective view of the slide shown in FIG. 10, FIG. 16 is a view when the strap according to this embodiment is locked, FIG. 17 is a view when the strap according to the present embodiment is unlocked.

The strap 3 is a belt-shaped member, and may comprise one end 31 and the other end 32 in its longitudinal direction. The strap 3 may be formed of a material that can be bent or flexible, for example, leather, fabric, plastic with elasticity, or the like.

One of One end 31 and the other end 32 of the strap 3 can be fixed to the body 1, and the other of the one end 31 and the other end 32 is slid along the periphery of the main body 1.

If one end 31 of the strap 3 slides along the rim 14 of the main body 1, the portion between one end 31 and the other end 32 extends to the outside of the strap receiving portion 13, depending on the position of one end 31 of the strap 3, the length of the portion drawn out of the strap receiving portion 13 may be increased or decreased.

One end 31 of the strap 3 may be slidably positioned on the lower part of the main body 1, and the other end 32 of the strap 3 may be positioned fixedly on the lower part of the main body 1.

The portion 3a drawn out of the strap receiving portion 13 may be defined as an 'exposed portion', and the portion 3b of the strap 3 accommodated in the strap receiving portion 13 may be defined as 'hidden portion'.

One end 31 of the strap 3 can be locked or unlocked by the strap locker 4, and when the one end 31 of the strap 3 is locked, the length of the exposed portion 3a is constant. And, when one end 31 of the strap 3 is unlocked, the length of the exposed portion 3a can be changed.

The display device may further comprise a strap locker 4.

The strap locker 4 is connected to the strap 3 to lock or unlock the strap 3.

An example of the strap locker 4 may include a rail 40, a slider 50, a slider holder 60 and a lever 70.

An example of the strap locker 4 may be a slider assembly including a slider 50 that slides along the main body 1.

An example of the strap locker 4 may be a lever-type locking device in which the position of the slider 50 and the position of the one end 31 of the strap 3 may be fixed or varied by operating the lever 70.

The rail 40 may be disposed to be fixed in position, the slider 50 may be disposed to slide in the left and right directions X, and the slider holder 60 may be disposed to be raised in the vertical direction Z. The lever 70 may be disposed to be rotated clockwise and counterclockwise, and can raise the slider holder 60.

An example of the strap locker 4 may be disposed at the bottom of the main body 1, and is preferably concealed in the main body 1 as much as possible.

An example of the strap locker 4 may be disposed such that the lever 70 is exposed to the lower side of the main body 1, and the slider 50 and the slider holder 60 are preferably disposed inside the main body 1.

The rail 40 may be fixed to the main body 1. The rail 40 may be disposed long in the left-right direction X under the main body 1.

The rail 40 may be fastened to the lower portion of the main body 1 with a fastening member 41 such as a screw. A fastening member through hole 42 through which the fastening member 41 passes may be formed in the rail 40.

At least one rail hole 43 may be formed in the rail 40. A plurality of rail holes 43 may be formed in the rail 40. A plurality of rail holes 43 may be spaced apart from each other in the longitudinal direction of the rail 40.

The rail 40 may constrain or release the slider holder 60. The plurality of rail holes 43 may function as locking holes that restrain the slider holder 60 in the left and right directions (X).

The slider 50 may be connected to the strap 3. The slider 50 may be connected to one end 31 of the strap 3, and may slide in the left and right direction X together with the one end 31 of the strap 3. The slider 50 may be disposed long in the left and right direction (X) on the lower part of the main body 1.

The slider 50 may be disposed between the middle bracket 17 and the rail 40 to be movable in the left and right directions X. The slider 50 may be arranged to be caught on the middle bracket 17 in an upward direction.

When the slider holder 60 is raised and the slider 50 is constrained by the slider holder 60, the slider 50 cannot slide in the left and right direction X, and when the slider holder 60 is lowered and the slider 50 is released from the slider holder 60, the slider 50 can slide in the left and right direction X.

At least one slider hole 53 may be formed in the slider 50. A plurality of slider holes 53 may be formed in the slider 50. A plurality of slider holes 53 may be spaced apart from each other in the longitudinal direction of the slider 50. The distance between the plurality of slider holes 53 may be the same as the distance between the plurality of rail holes 43.

A gap (T6, see FIGS. 16 and 17) into which the lever 70 can be inserted may be formed between the slider 50 and the rail 40.

The slider holder 60 may be disposed to move up and down between the slider 50 and the rail 40.

The slider holder 60 may comprise a first protrusion 61 inserted into the rail hole 43 and a second protrusion 62 inserted into the slider hole 53. The slider holder 60 may comprise a slider body 63 positioned between the slider 50 and the rail 40.

One example of the slider holder 60 is that the first protrusion 61 protrudes downward from the lower surface of the slider body 63, and the second protrusion 62 extends upward from the upper surface of the slider body 63.

In another example of the slider holder 60, a fixing pin 64 is disposed to pass through a fixing hole 63a formed in the slider body 63, and a portion positioned below the fixing hole 63a is a first protrusion 61, and a portion located on the upper side of the fixing hole 63a may be the second protrusion 62.

The slider holder 60 can be lowered at a lowering height where the first protrusion 61 is inserted into the rail hole 43 of the rail 40 and caught on the rail 40 in the left and right direction X. The second protrusion 62 can be located in the second through hole 53 of the slider 50, and the slider 50 can be constrained to the rail 40 by the slider holder 60.

The lower height may be a locking height at which the slider 50 is locked to the rail 40 through the slider holder 60 so that the one end 31 of the strap 3 is locked.

The slider holder 60 is raised at an elevated height where the first protrusion 61 is positioned above the rail hole 43 of the rail 40 so that the first protrusion 61 is not caught on the rail 40 in the left and right directions X. The second protrusion 62 can be positioned in the second through hole 53 of the slider 50, and the slider 50 can be released from the rail 40, The elevated height may be an unlocking height at which the slider 50 and the slider holder 60 are not locked to the rail 40 and the one end 31 of the strap 3 is unlocked.

A plurality of first protrusions 61 may be provided, and the plurality of first protrusions 61 may be spaced apart from each other in the longitudinal direction of the slider body 63.

The number of first protrusions 61 may be less than the number of rail holes 43, the plurality of first protrusions 61 may be inserted into only some of the plurality of rail holes 43, and the plurality of first protrusions 61 may not be inserted into the rest of the plurality of rail holes 43.

A plurality of second protrusions 62 may be provided, and the plurality of second protrusions 62 may be spaced apart from each other in the longitudinal direction of the slider body 63.

The number of second protrusions 62 may be the same as the number of slider holes 53, and the second protrusions 62 may correspond 1:1 to the slider holes 53. The second protrusion 62 may remain inserted into the slider hole 53 regardless of the height of the slider holder 60.

The lever 70 may be rotatably disposed on the slider 50. The lever 70 may be connected to the slider 50 through a rotation shaft 71.

The rotating shaft 71 may be disposed long in the front and rear direction, and may rotatably support the lever 70 on the slider 50. The lever 70 may rotate in a clockwise/counterclockwise direction around the rotation shaft 71.

A rotation shaft hole 72 (see FIG. 14) into which the rotation shaft 71 is inserted may be formed in the lever 70.

An accommodating portion 52 (see FIG. 15) in which the rotating shaft 71 is rotatably accommodated may be formed in the slider 50.

The rotation shaft 71 may be disposed in the rotation shaft hole 72 of the lever 70 and the accommodating portion 52 of the slider 50.

As shown in FIGS. 9 and 16, the lever 70 can be rotated to be long approximately in the left and right direction X, and can be accommodated in the gap T6 between the rail 50 and the slider 50.

As shown in FIGS. 10 and 17, the lever 70 may be rotated to be long in an approximately vertical direction Z.

The lever 70 may move the slider holder 60 so that the first protrusion 61 is drawn out of the rail hole 43. As shown in FIGS. 10 and 12, the lever 70 can raise the slider holder 60 when the lever 70 is disposed long in the vertical direction Z. The first protrusion 61 can be raised above the rail hole 43 and the first protrusion 61 can be unlocked, when the slider holder 60 is raised.

The lever 70 may comprise a pressing body 75.

As shown in FIGS. 10 and 12, when the lever 70 is rotated about the rotation shaft 71, the pressing body 75 comes in contact with the slider holder 60 to raise the slider holder 60.

The slider holder 60 may comprise a lever contact body 65 to which the lever 70 is contacted or spaced apart. The lever contact body 65 may be spaced apart from or in contact with the pressure body 75. The lever contact body 65 may protrude forward and backward from the slide body 63.

The lever 70 may comprise a cam body 77.

As shown in FIG. 16, when the lever 70 is reversely rotated about the rotating shaft 71, the cam body 77 contacts the upper surface of the slider holder 60 and moves the slider holder 60 downward and the slider holder 60 can be pressurized downward by the cam body 77. When the slider holder 60 is lowered, the first protrusion 61 may be inserted into the rail hole 43 and locked.

When the lever 70 is rotated around the rotation shaft 71 as shown in FIG. 17, the cam body 77 may be spaced apart from the upper surface of the slider holder 60, and the slider holder 60 may be raised by the pressing body 75 (see FIGS. 10 and 12).

A pair of levers 70 may be provided to the slider 50, and the pair of levers 70 may be spaced apart in the left and right direction X. A pair of levers 70 may be installed symmetrically.

An example of the strap locker 4 may further comprise a lever lock 80 (see FIGS. 13 and 14).

The lever lock 80 may be movably disposed on the lever 70. The lever lock 80 may be disposed on the lever 70 to move in the longitudinal direction of the lever 70.

The lever lock 80 restricts arbitrary rotation of the lever 70, and may be locked or unlocked from the slider 50.

A locking hole 58 into which the lever lock 80 is locked may be formed in the slider 50, and the lever lock 80 may be locked or unlocked in the locking hole 58.

The lever lock 80 may comprise an insertion portion 82 into which a user's finger or a tool used by the user may be inserted. The insertion part 82 may be a groove part or a hole formed at one end of the lever lock 80. A user's finger or tool may be inserted into the insertion portion 82 and may push the lever lock 80 in the longitudinal direction of the lever lock 80.

The lever lock 80 may comprise a deformable portion 84 that can be elastically deformed.

The deformable portion 84 may be formed at the other end of the lever lock 80. The deformable portion 84 may be formed on the opposite side of the insertion portion 82 in the longitudinal direction of the lever lock 80.

A protrusion 85 that can be inserted into and caught in the locking hole 58 of the slider 50 may protrude from the deformable portion 84.

The lever lock 80 may further comprise a bridge portion 86 connecting the insertion portion 82 and the deformable portion 84. The bridge portion 86 may be formed long in the longitudinal direction of the lever lock 80.

A lever lock guide (78, see FIG. 14) guiding the lever lock 80 may be formed on the lever 70.

The lever lock guide 78 can guide the lever lock 80 in the longitudinal direction.

The lever lock guide 78 may be a groove portion into which the lever lock 80 is inserted and accommodated.

The lever lock guide 78 may elastically deform the deformable portion 84 of the lever lock 80.

In a state where the lever lock 80 is inserted into the lever lock guide 78, the lever lock 80 can be moved in the longitudinal direction of the lever lock 80, and the lever lock guide 78 can elastically deform the deformable portion 84. The protrusion 85 may be inserted into or pulled out of the locking hole 58 of the slider 50 by the elastic deformation of the deformable portion 84.

When the protrusion 85 of the lever lock 80 is inserted into the locking hole 58 of the slider 50, the lever lock 80 and the lever 70 are locked to the slider 50 and the rotating arbitrarily of the lever 70 can be limited, and the current state of the strap locker 4 (that is, a locked state or an unlocked state) can be maintained.

When the protrusion 85 of the lever lock 80 is drawn out into the locking hole 58 of the slider 50, the lever lock 80 and the lever 70 are unlocked from the slider 50. The lever 70 can be a rotatable state, and the state of the strap locker 4 (that is, a locked state or an unlocked state) can be a changeable state.

An example of the strap locker 4 may further comprise an elastic member 90 (see FIG. 12).

The elastic member 90 may be disposed on the slider 50 to elastically support the slider holder 60.

In the absence of an external force, the elastic member 90 may press the slider holder 60 downward, and the slider holder 60 may be pushed downward by the elastic member 90, and the first protrusion 61 may be inserted into the rail hole 43 of the rail 40.

An example of the elastic member 90 may be a coil spring, the upper end of which may be in contact with the slider 50, and the lower end of which may be in contact with the upper surface of the slider holder 60, particularly the slider body 63.

The elastic member 90 may be disposed to surround a portion of the second protrusion 62, and arbitrary removal may be restricted by the second protrusion 62.

An example of the strap locker 4 may further comprise a strap clamp plate 100.

The strap clamp plate 100 may be formed of a material that is more rigid than the strap 3, and may be installed to firmly connect one end 31 of the strap 3 to the slider 50.

The strap clamp plate 100 may be disposed between the rail 40 and the strap 3. The strap clamp plate 100 may be disposed on the bottom surface of one end 31 of the strap 3.

As shown in FIGS. 10 and 11, one end 31 of the strap 3 may be positioned between the strap clamp plate 100 and the slider 50, and one end 31 of the strap 3 may be connected to the slider 50 by and the fastening member 102 passing through the strap clamp plate 100, the one end 31 of strap 3 and the slider 50 sequentially.

That is, the strap clamp plate 100 is for fastening one end 31 of the strap 3 to the slider 50, and fastening holes through which the fastening member 102 (see FIG. 11) passes may be respectively formed at the strap clamp plate 100, the strap 3, and the slider 50.

The fastening member 102 may comprise a head portion and a screw portion formed on an upper side of the head portion, and the head portion may be positioned below the strap clamp plate 100.

Hereinafter, the adjustment of the strap 3 using an example of the strap locker 4 will be described.

First, after inserting a finger or a tool into the insertion portion 82 of the locker lock 80, the user can push the locker lock 80 in the left and right directions X.

The locker lock 80 can be slid in the left and right direction X along the lever lock guide 78 of the lever 70, and the deformable portion 84 of the locker lock 80 is on the lever lock guide 78 can be elastically deformed, the protrusion 85 can come out of the locking hole 58 of the slider 50, and can be unlocked from the slider 50. As the lever lock 80 is unlocked, the lever 70 may be rotatable around the rotation shaft 71.

Figure 18:
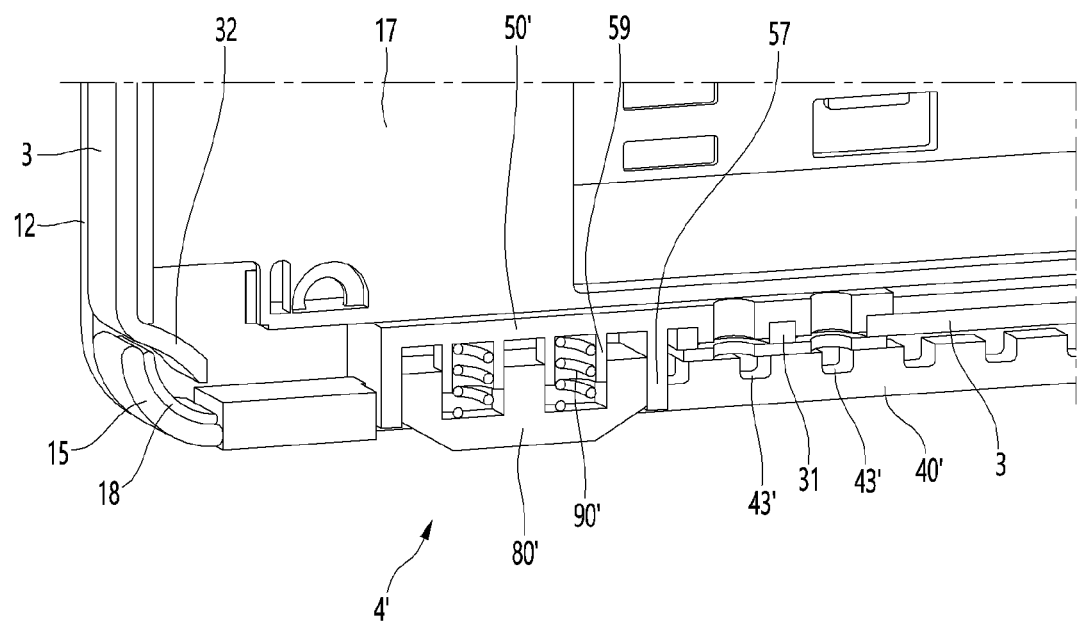
FIG. 18 is a partially cut-off perspective view when another example of the strap locker according to the present embodiment is installed in the main body.

When the user pulls the lever 70 downward, the lever 70 is rotated about the rotation shaft 71, and as shown in FIG. 18, the pressing body 75 of the lever 70 is the lever contact body 65 to raise the slider holder 60.

When the slider holder 60 is lifted, the first protrusion 61 can be raised above the rail hole 43 and the slider holder 60 can be unlocked from the rail 40.

The user can hold the lever 70 and move it in the left and right direction X, and the slider 50 connected to the lever 70 by the hinge shaft 71 can be slid in the left and right directions X and the slider holder 60 into which the protrusion 62 is inserted into the second slider hole 53 of the slider 50 can be slid in the left and right directions X together.

As the slider 50 slides in the left and right direction X, one end 31 of the strap 3 can slide in the left and right direction X along with the slider 50, and a portion of the strap 3 is drawn out to the outside of the strap receiving portion 13.

As the slider 50 is moved, the length of the exposed portion of the strap 3 may be increased, and the user may rotate the lever 70 upward again.

As shown in FIG. 16, the lever 70 can be inserted into the gap T6 between the rail 40 and the slider 70, and the slider holder 60 can be pressed in the downward direction by the cam body 77 of the lever 70. The slider holder 60 is lowered by the cam body 77 of the lever 70, and the first protrusion 61 can be inserted into the rail hole 43 of the rail 40 and locked to the rail 40.

And, the user can move the lever lock 80 in the opposite direction to the locking of the lever lock 80, and the protrusion 85 of the lever lock 80 is inserted into the locking hole 58 of the slider 50 and can be locked to the slider 50.

The slider 50 can be fixed in position as the slider holder 60 is locked to the rail 40, and the length of the exposed portion of the strap 3 does not change.

A user may carry the display device or hang the display device on a wall using the exposed portion of the strap 3.

Figure 19:
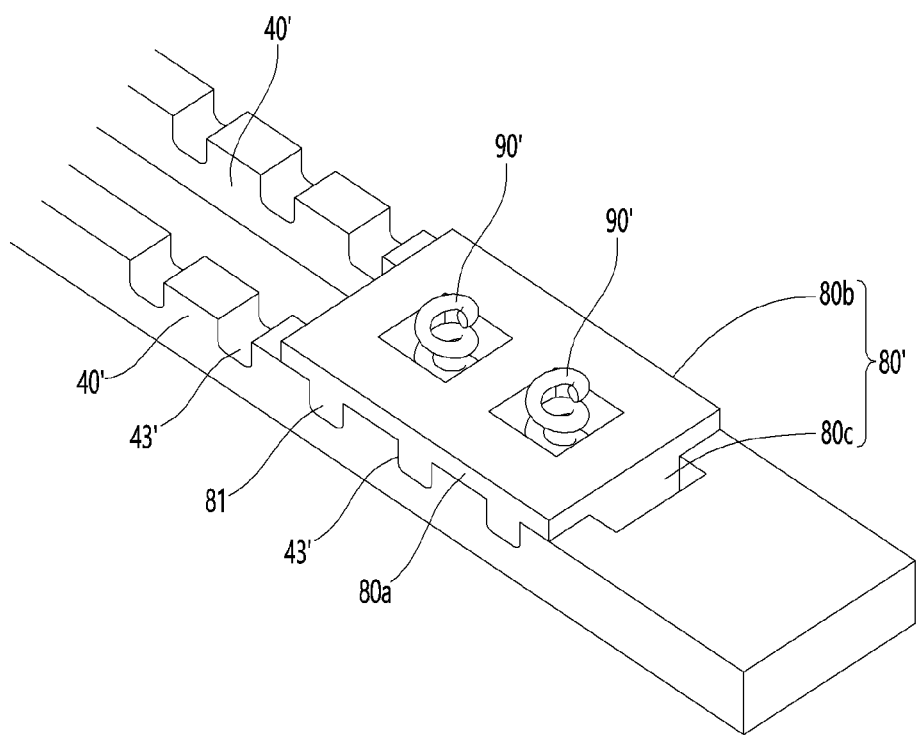
FIG. 19 is a perspective view in which a part of the button shown in FIG. 18 is cut off.
Figure 20:
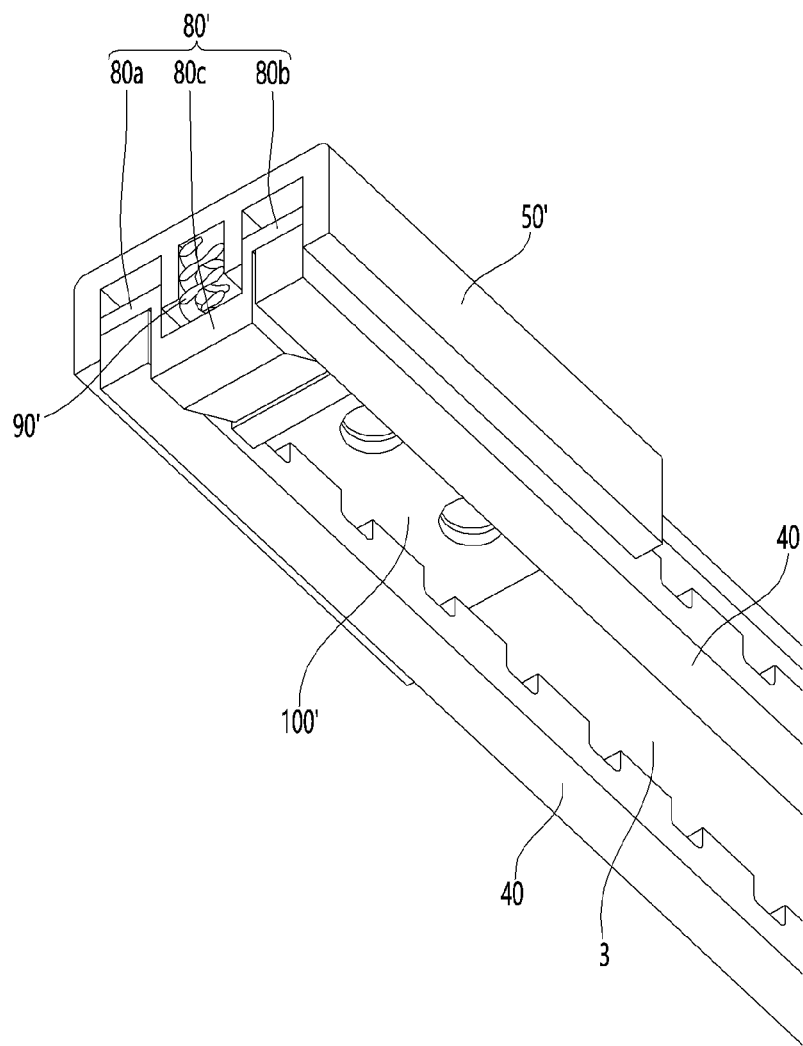
FIG. 20 is a partially cut-off cross-sectional view of the strap locker shown in FIG. 18.

FIG. 18 is a partially cut-off perspective view when another example of the strap locker according to the present embodiment is installed in the main body, FIG. 19 is a perspective view in which a part of the button shown in FIG. 18 is cut off, FIG. 20 is a partially cut-off cross-sectional view of the strap locker shown in FIG. 18.

Another example of the strap locker 4' may comprise a rail 40', a slider 50', a button 80', and an elastic member 90'.

Another example of the strap locker 4 may be a slider joint that comprises a slider 50' that slides along the main body 1.

Another example of the strap locker 4' is a button-type locking device in which the position of the slider 50' and the position of the one end 31 of the strap 3 can be fixed or varied by operating the button 80'.

The rail 40' may be fixed to the main body 1. A plurality of locking grooves 53' may be formed in the rail 40'.

A pair of rails 40' may be provided, and the pair of rails 40' may be spaced apart in the front and rear direction.

The slider 50' may be disposed between the middle bracket 17 and the rail 40'.

The slider 50' may be connected to the strap 3. The slider 50' may be connected to one end 31 of the strap 3.

A button accommodating portion 57 accommodating the button 80' may be formed in the slider 50'.

An elastic member accommodating portion 59 accommodating the elastic member 90' may be formed in the slider 50'.

The button 80' can be locked or unlocked to the rail 40'.

The button 80' may have a locking protrusion 81 formed thereon. The locking protrusion 81 may be seated on the rail 40' and caught in the locking groove 53'.

The button 80' can be lifted by a user's hand or tool, and when the button 80' is lifted, the locking protrusion 81 can come out of the locking groove 53', and the button 80 can be unlocked from the rail 40'.

When no external force acts on the button 80', the button 80' can be pressed downward by the elastic member 90', and the locking protrusion 81 can be inserted into the locking groove 53', and the button 80 can be locked on the rail 40'.

The button 80' may comprise a pair of seating bodies 80a and 80b and a button body 80c

A pair of seating bodies 80a and 80b may be accommodated in the button accommodating portion 57 and placed on each of the pair of rails 40.

The button body 80c may penetrate between the pair of rails 40. An elastic member 90' may be seated on the button body 80c.

The elastic member 90' may be disposed between the slider 50' and the button 80'. The elastic member 90' may support the button 80'.

An example of the elastic member 90' may be a coil spring, the upper end of which may be in contact with the slider 50', and the lower end of which may be in contact with the button 90, particularly the button body 80c.

The elastic member 90 may be surrounded by the slider 50' and the button 90', and arbitrary removal may be limited by the button accommodating part 57.

Another example of the strap locker 4' may further comprise a strap clamp plate 100'.

The strap clamp plate 100' may be formed of a material that is more rigid than the strap 3, and may be installed to firmly connect one end 31 of the strap 3 to the slider 50'.

The strap clamp plate 100' may be disposed between the rail 40 and the strap 3. The strap clamp plate 100' may be disposed on the bottom of one end 31 of the strap 3.

As shown in FIGS. 18 and 20, one end 31 of the strap 3 may be positioned between the strap clamp plate 100' and the slider 50, one end 31 of the strap 3 may be connected to the slider 50' by a fastening member (not shown) sequentially penetrating the strap clamp plate 100' and one end 31 of the strap 3 and the slider 50.

That is, the strap clamp plate 100' is for fastening the one end 31 of the strap 3 to the slider 50', and the strap clamp plate 100', the strap 3, and the slider 50 may be respectively formed with fastening holes through which fastening members pass.

Hereinafter, the adjustment of the strap 3 using another example of the strap locker 4' will be described.

First, the user can press the button 80' in an upward direction, the locking protrusion 81 of the button 80' can be raised above the locking groove 53' of the rail 40', and the button 80 'can be unlocked from the rail 40'.

The user can slide the button 80' in the left and right directions X, and the slider 50' having the button accommodating portion 57 in which the button 80' is accommodated can slide together with the button 80'.

As the slider 50' slides in the left and right direction X, one end 31 of the strap 3 can slide along with the slider 50 in the left and right direction X, and a portion of the strap 3 is drawn out of the strap receiving portion 13.

As the slider 50' moves, the length of the exposed portion of the strap 3 may increase.

When the user no longer presses the button 80' in an upward direction, the elastic member 90' may press the button 80' downward by an elastic restoring force, and locking protrusion 81 can be inserted into the locking groove 53' of the rail 40', and the button 80' can be locked in the rail 40'.

The slider 50' can be fixed in position as the button 80' is locked to the rail 40', and the length of the exposed portion of the strap 3 does not change.

A user may carry the display device or hang the display device on a wall using the exposed portion of the strap 3.

Figure 21:
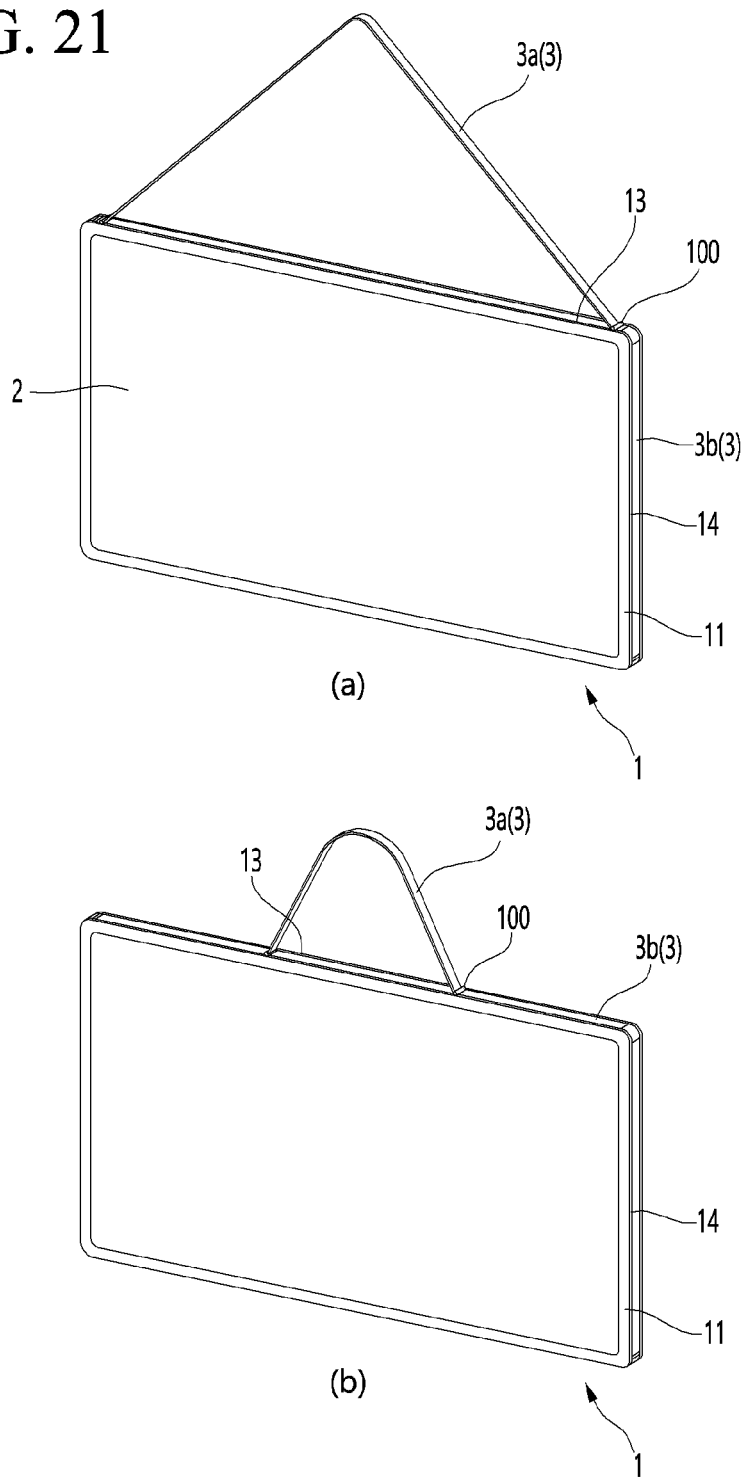
FIG. 21 is a view showing a modified example of the display device according to the present embodiment.
Figure 22:
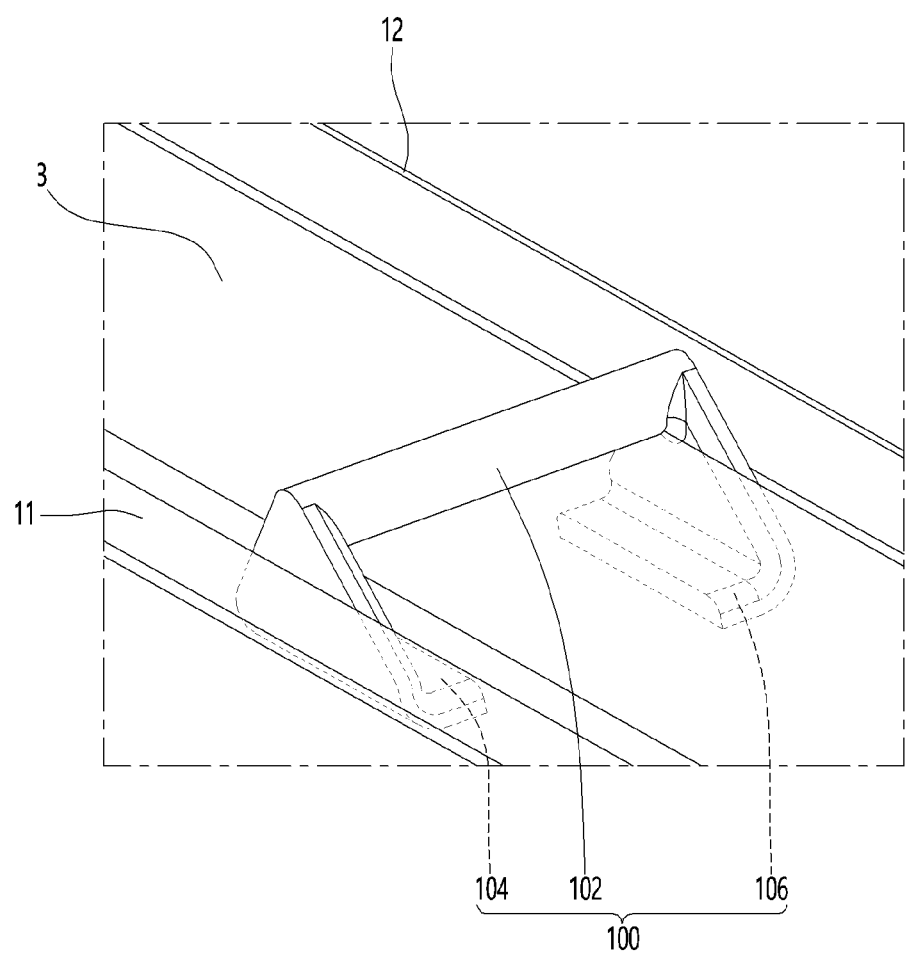
FIG. 22 is an enlarged view of the strap adjusting clip shown in FIG. 21.
Figure 23:
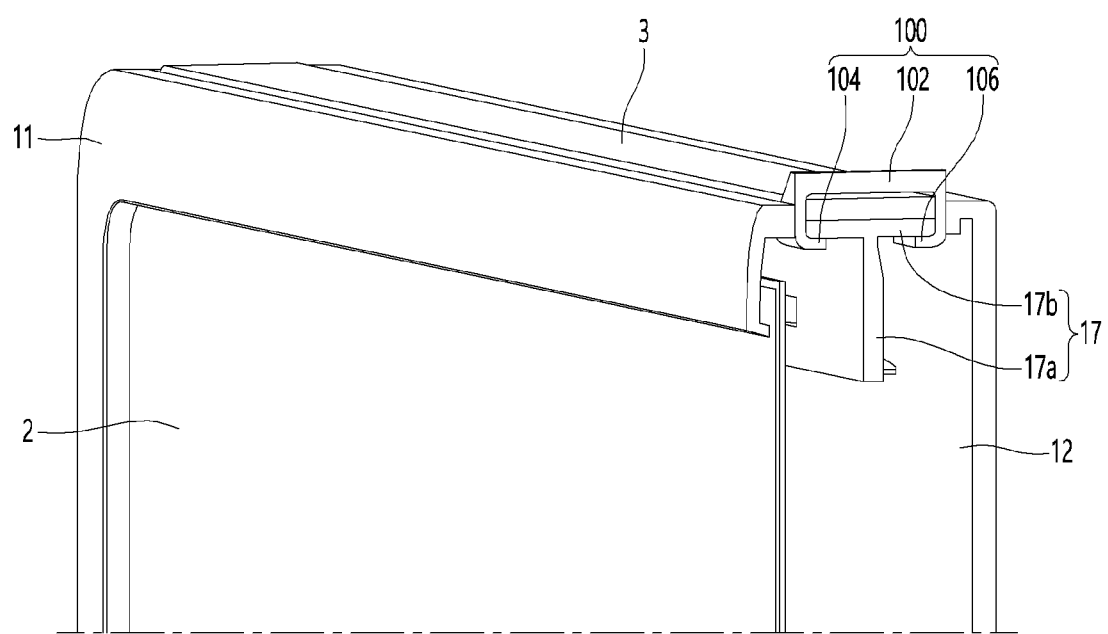
FIG. 23 is a partially cut-off perspective view of a modified example of the display device according to the present embodiment.
Figure 24:
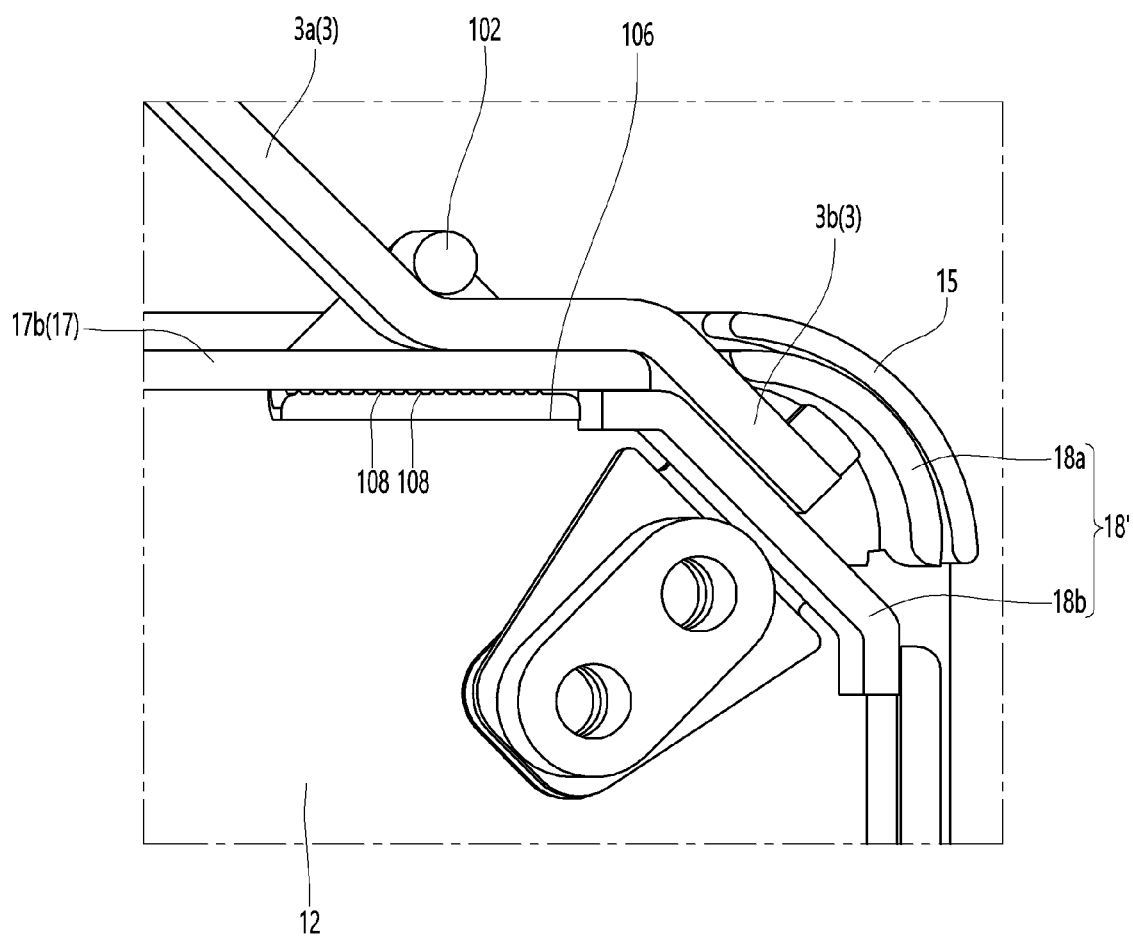
FIG. 24 is a cross-sectional view showing the inside of a modified example of the display device according to the present embodiment.

FIG. 21 is a view showing a modified example of the display device according to the present embodiment, FIG. 22 is an enlarged view of the strap adjusting clip shown in FIG. 21, FIG. 23 is a partially cut-off perspective view of a modified example of the display device according to the present embodiment, FIG. 24 is a cross-sectional view showing the inside of a modified example of the display device according to the present embodiment.

The display device may further comprise a strap adjusting clip 10.

The strap adjustment clip 10 may be movably disposed along the strap receiving portion 13.

As shown in (a) of FIG. 21, the strap adjustment clip 10 can be moved close to the vertex portion of the display device, and as shown in (b) of FIG. 21, the strap adjustment clip 10 can be moved closer to the center of the top of the display device.

The strap 3 may have a length of a portion (that is, an exposed portion) drawn out of the strap accommodating portion 13 according to the position of the strap adjusting clip 10.

As shown in (a) of FIG. 21, when the strap adjusting clip 10 is close to the vertex portion of the display device, the length of the portion of the strap 3 drawn out of the strap receiving portion 13 of the strap 3 may be long.

As shown in (b) of FIG. 21, when the strap adjustment clip 10 is close to the top center of the display device, the length of the portion of the strap 3 drawn out of the strap receiving portion 13 may be short.

The strap adjustment clip 10 may comprise an upper guide 102 in which the strap 3 can be bent, and sliding guides 104 and 106 integrally formed with the upper guide 102 and guided along the middle bracket 17.

The upper guide 102 may be formed long in the front and rear directions.

The middle bracket 17 may comprise a vertical portion 17a extending vertically and a horizontal portion 17b protruding horizontally from an upper portion of the vertical portion 17a.

A portion of the strap 3 may be placed on the horizontal portion 17b, and the sliding guides 104 and 106 may come into contact with the lower surface of the horizontal portion 17b.

At least one of the sliding guides 104 and 106 and the horizontal portion 17b may be formed with a friction portion 108 such as a dimple capable of increasing friction between the sliding guides 104 and 106 and the horizontal portion 17b.

According to this embodiment, the strap is accommodated in the strap receiving portion recessed into the periphery of the main body, so that the strap may not be seen from the front, and the appearance of the display device may be improved.

In addition, since the main body comprise a strap guide, the strap can be protected, and the strap can be concisely arranged.

In addition, the guide bracket disposed inside the strap guide guides the strap, so that damage to the strap and the strap guide can be minimized.

In addition, the length of the exposed portion of the strap can be easily adjusted by the strap adjusting clip.

In addition, since a user can lock/unlock the strap by rotating or reversely rotating the lever, the user can easily change the length of the exposed portion of the strap.

In addition, since the lever can be locked/unlocked to the slider by the lever lock, random rotation of the lever can be minimized, and the strap can be held with high reliability.

In addition, since the strap locker can unlock the strap by pressing a button, the user can conveniently change the length of the exposed portion of the strap.

The above-disclosed subject matter is to be considered illustrative, and not restrictive, and the appended claims are intended to cover all such modifications, enhancements, and other embodiments, which fall within the true spirit and scope of the present disclosure.

Thus, the embodiment of the present disclosure is to be considered illustrative, and not restrictive, and the technical spirit of the present disclosure is not limited to the foregoing embodiment.

Therefore, the scope of the present disclosure is defined not by the detailed description of the invention but by the appended claims, and all differences within the scope will be construed as being included in the present disclosure.

What is claimed is:

1. A display device comprising:
   a main body comprising a strap receiving portion recessed at a periphery of the main body;
   a display panel installed in the main body;
   a strap accommodated along the periphery of the main body in the strap receiving portion; and
   a strap locker connected to the strap to lock or unlock the strap,
   wherein the main body further comprises a strap guide disposed at the periphery of the main body and spaced apart from the strap receiving portion.

2. The display device of claim 1, wherein the main body comprises:
   a top case forming a front of the display device; and
   a bottom cover forming a rear of the display device,
   wherein at least one of the top case or the bottom cover is formed to define the strap receiving portion.

3. The display device of claim 1, further comprising a guide bracket disposed inwardly from the strap guide.

4. The display device of claim 3, wherein the guide bracket comprises:
   an outer guide bracket; and
   an inner guide bracket disposed inwardly from the outer bracket,
   wherein the strap passes through a space between the outer guide bracket and the inner guide bracket.

5. The display device of claim 1, further comprising a strap adjusting clip movably disposed along the strap receiving portion.

6. The display device of claim 5, wherein the main body further comprises;
   a top case forming a front of the display device;
   a bottom cover forming a rear of the display device, and
   a middle bracket disposed between the display panel and the bottom cover,
   wherein the strap adjustment clip comprises a sliding guide configured to allow the strap adjustment clip to slide along the middle bracket.

7. A display device comprising:
   a main body comprising a strap receiving portion recessed at a periphery of the main body;
   a display panel installed in the main body;
   a strap accommodated along the periphery of the main body in the strap receiving portion; and
   a strap locker connected to the strap to lock or unlock the strap,
   wherein the strap locker comprises:
   a rail fixed to the main body and formed with at least one rail hole;
   a slider connected to the strap and having at least one slider hole;
   a slider holder having a first protrusion configured to be inserted into the at least one rail hole and a second protrusion configured to be inserted into the at least one slider hole; and
   a lever configured to move the slider holder so that the first protrusion is drawn out of the at least one rail hole.

8. The display device of claim 7, wherein the strap locker further comprises a movable lever lock disposed on the lever,
   wherein the slider comprises a locking hole configured to engage the lever lock to restrict movement of the lever.

9. The display device of claim 8, wherein the lever is formed with a lever lock guide configured to guide movement of the lever lock along a longitudinal direction, wherein the lever lock guide causes the lever lock to be elastically deformed during the movement.

10. The display device of claim 7, wherein the slider comprises an accommodating portion configured to accommodate a rotation shaft of the lever.

11. The display device of claim 10, wherein the lever comprises a cam body configured to contact the slider holder and configured to cause the slider holder to be raised or lowered based on rotation of the lever rotates about the rotation shaft.

12. The display device of claim 7, wherein the lever comprises a pressing body configured to contact and press the slider holder to raise the slider holder when the lever is rotated about a rotation shaft of the lever.

13. The display device of claim 12, wherein the slider holder comprises a lever contact body configured to be moved to be spaced apart from or in contact with the pressing body.

14. The display device of claim 7, wherein the strap locker further comprises an elastic member disposed on the slider and elastically supporting the slider holder.

15. The display device of claim 7, wherein the lever is accommodated in a gap formed between the rail and the slider.

16. The display device of claim 7, wherein the strap locker further comprises a strap clamp plate disposed between the rail and the strap, and
   wherein the strap clamp plate, the strap, and the slider are each respectively formed with fastening holes configured to allow a fastening member to pass therethrough.

17. A display device comprising:
   a main body comprising a strap receiving portion recessed at a periphery of the main body;
   a display panel installed in the main body;
   a strap accommodated along the periphery of the main body in the strap receiving portion; and
   a strap locker connected to the strap to lock or unlock the strap,
   wherein the strap locker comprises:
   a rail fixed to the main body and having a plurality of locking grooves;

a slider connected to the strap and having a button accommodating portion;

a button seated on the rail and formed with a locking protrusion caught in the locking grooves; and an elastic member disposed between the slider and the button to support the button.

18. The display device of claim 17, wherein a pair of the rails are spaced apart in a front and rear direction, wherein the button comprises;

a pair of seating bodies accommodated in the button accommodating portion and mounted on each of a pair of rails; and a button body penetrating between the pair of rails, wherein the elastic member seated on the button body.

19. The display device of claim 17, wherein the main body comprises;

a top case forming an outer peripheral appearance of the display device;

a bottom cover forming a rear appearance of the display device, and a middle bracket disposed between the display panel and the bottom cover, wherein the slider is arranged between the middle bracket and the rail.

\* \* \* \* \*